(12) United States Patent
Tropp et al.

(10) Patent No.: US 11,649,320 B2
(45) Date of Patent: May 16, 2023

(54) THIOL-BASED POST-MODIFICATION OF CONJUGATED POLYMERS

(71) Applicants: Joshua Tropp, Hattiesburg, MS (US); Douglas V. Amato, Hattiesburg, MS (US); Derek L. Patton, Hattiesburg, MS (US); Jason D. Azoulay, Hattiesburg, MS (US)

(72) Inventors: Joshua Tropp, Hattiesburg, MS (US); Douglas V. Amato, Hattiesburg, MS (US); Derek L. Patton, Hattiesburg, MS (US); Jason D. Azoulay, Hattiesburg, MS (US)

(73) Assignee: University of Southern Mississippi, Hattiesburg, MS (US)

( * ) Notice: Subject to any disclaimer, the term of this patent is extended or adjusted under 35 U.S.C. 154(b) by 0 days.

(21) Appl. No.: 16/579,694

(22) Filed: Sep. 23, 2019

(65) Prior Publication Data

US 2020/0095371 A1 Mar. 26, 2020

Related U.S. Application Data

(60) Provisional application No. 62/734,805, filed on Sep. 21, 2018.

(51) Int. Cl.
*C08G 61/12* (2006.01)
*C08G 61/02* (2006.01)

(52) U.S. Cl.
CPC .......... *C08G 61/126* (2013.01); *C08G 61/02* (2013.01); *C08G 2261/124* (2013.01);
(Continued)

(58) Field of Classification Search
CPC ............ C08G 61/126; C08G 2261/124; C08G 2261/1412; C08G 2261/1426;
(Continued)

(56) References Cited

U.S. PATENT DOCUMENTS 5,510,438 A 4/1996 Ferraris et al.
5,552,236 A 9/1996 Ohtake et al.
(Continued)

FOREIGN PATENT DOCUMENTS

EP 0223336 A1 8/1987
EP 1756193 B1 11/2009
(Continued)

OTHER PUBLICATIONS

London, Alexander E., et al. "Donor-acceptor polymers with tunable infrared photoresponse." Polymer Chemistry 8.19 (2017): 2922-2930.
(Continued)

*Primary Examiner* — Shane Fang

(74) *Attorney, Agent, or Firm* — Mendelsohn Dunleavy, P.C.

(57) ABSTRACT

The present invention provides novel polymer compounds and methods and processes for polymerizing and synthesizing the new polymers by post-modifying conjugated polymers bearing unsaturated functionalities. The post-modifications are facilitated by light-mediated initiators, thermal initiators, redox-based initiators, small molecule-based initiators, or a combination thereof. Syntheses and post-modifications are carried out to high conversion via thiol-ene "click" chemistry-based mechanisms. The products comprise monomeric, oligomeric, and polymeric materials with easily-accessible pendant functionalities which impart new, distinct, and/or improved properties.

1 Claim, 10 Drawing Sheets

(52) U.S. Cl.
CPC .......... C08G 2261/145 (2013.01); C08G 2261/1412 (2013.01); C08G 2261/1426 (2013.01); C08G 2261/18 (2013.01); C08G 2261/228 (2013.01); C08G 2261/3142 (2013.01); C08G 2261/3223 (2013.01); C08G 2261/78 (2013.01)

(58) Field of Classification Search
CPC .......... C08G 2261/18; C08G 2261/228; C08G 2261/43; C08G 2261/312; C08G 2261/145; C08G 2261/1424; C08G 2261/514; C08G 2261/3223; C08G 2261/3142; C08G 2261/78; H01M 4/608; H01M 10/0565
See application file for complete search history.

(56) References Cited

U.S. PATENT DOCUMENTS

| | | |
|---|---|---|
| 5,629,665 A | 5/1997 | Kaufmann et al. |
| 6,083,557 A | 7/2000 | Belcher et al. |
| 6,262,306 B1 | 7/2001 | Leriche et al. |
| 6,835,576 B2 | 12/2004 | Matsuzaki et al. |
| 6,982,514 B1 | 1/2006 | Lu et al. |
| 8,283,438 B2 | 10/2012 | David et al. |
| 8,471,204 B2 | 6/2013 | Bornfreund |
| 8,507,865 B2 | 8/2013 | Boberl et al. |
| 8,658,751 B2 | 2/2014 | Han et al. |
| 8,809,487 B2 | 8/2014 | Seferos et al. |
| 9,035,016 B2 | 5/2015 | Seferos et al. |
| 9,127,020 B2 | 9/2015 | Hildebrandt et al. |
| 9,985,211 B2 | 5/2018 | Blouin et al. |
| 10,914,637 B2 | 2/2021 | Lin et al. |
| 2003/0062480 A1 | 4/2003 | Kanzaki |
| 2004/0115437 A1 | 6/2004 | Dammann et al. |
| 2004/0187917 A1 | 9/2004 | Pichler |
| 2006/0269664 A1 | 11/2006 | Gleason et al. |
| 2007/0014939 A1 | 1/2007 | Gaudiana et al. |
| 2007/0111027 A1 | 5/2007 | Chen et al. |
| 2007/0138945 A1 | 6/2007 | Hoshi et al. |
| 2010/0181552 A1 | 7/2010 | So |
| 2011/0006287 A1 | 1/2011 | You et al. |
| 2011/0028656 A1 | 2/2011 | Bazan et al. |
| 2011/0049367 A1 | 3/2011 | Forrest et al. |
| 2012/0153274 A1 | 6/2012 | Sonar et al. |
| 2012/0178893 A1* | 7/2012 | Martin .......... C08G 61/126 528/30 |
| 2013/0032791 A1 | 2/2013 | Bazan et al. |
| 2013/0092912 A1 | 4/2013 | You |
| 2014/0080986 A1 | 3/2014 | Bazan et al. |
| 2015/0056142 A1 | 2/2015 | Tao et al. |
| 2015/0218444 A1 | 8/2015 | Kang et al. |
| 2016/0118444 A1 | 4/2016 | Liu |
| 2017/0069814 A1 | 3/2017 | Bazan et al. |
| 2017/0324901 A1 | 11/2017 | Mandelli |
| 2018/0017679 A1 | 1/2018 | Valouch et al. |
| 2019/0194385 A1 | 6/2019 | Azoulay et al. |
| 2020/0052216 A1 | 2/2020 | Mitchell et al. |
| 2020/0095371 A1 | 3/2020 | Tropp et al. |
| 2020/0362098 A1 | 11/2020 | Azoulay et al. |
| 2021/0293706 A1 | 9/2021 | Tropp et al. |

FOREIGN PATENT DOCUMENTS

| | | |
|---|---|---|
| EP | 1743388 B1 | 3/2012 |
| JP | 2011116961 A | 6/2011 |
| JP | 2013254943 A | 12/2013 |
| JP | 2016065218 A | 4/2016 |
| KR | 10-2015-0113631 A | 10/2015 |
| WO | 99/19883 A1 | 4/1999 |
| WO | 2007016454 A2 | 2/2007 |
| WO | 2011028827 A2 | 3/2011 |
| WO | 2011028827 A3 | 3/2011 |
| WO | 2011052725 A1 | 5/2011 |
| WO | 2011156478 A2 | 12/2011 |
| WO | 2011156478 A3 | 12/2011 |
| WO | 2012136675 A3 | 10/2012 |
| WO | 2012174561 A2 | 12/2012 |
| WO | 2013124688 A3 | 8/2013 |
| WO | 2017125456 A1 | 7/2017 |
| WO | 2017180998 A2 | 10/2017 |
| WO | 2018009924 A1 | 1/2018 |
| WO | 2018039347 A2 | 3/2018 |
| WO | 2018039347 A3 | 3/2018 |
| WO | 2018085055 A1 | 5/2018 |
| WO | 2019012514 A1 | 1/2019 |
| WO | 2020072100 A1 | 4/2020 |
| WO | 2022026882 A1 | 2/2022 |

OTHER PUBLICATIONS

Wu, Zhenghui, et al. "Temperature-Dependent Detectivity of Near-Infrared Organic Bulk Heterojunction Photodiodes" ACS Applied Materials & Interfaces 9.2 (2017): 1654-1660.

Guarino, Vincenzo, et al. "Electro-Active Polymers (EAPs): A Promising Route to Design Bio-Organic/Bioinspired Platforms with on Demand Functionalities." Polymers 8.5 Article 185 (2016): (26 pages).

Jonas, Friedrich, et al. "Conductive modifications of polymers with polypyrroles and polythiophenes." Synthetic Metals 41.3 (1991): 831-836.

Mirabedini, Azadeh, et al. "Developments in conducting polymer fibres: from established spinning methods toward advanced applications." RSC Advances 6.50 (2016): 44687-44716.

Roncali, J. "Molecular Engineering of the Band Gap of π-Conjugated Systems: Facing Technological Applications." Macromolecular Rapid Communications 28.17 (2007): 1761-1775.

Wei, Bin, et al. "Post-polymerization functionalization of poly-(3,4-propylenedioxythiophene) (PProDOT) via thiol-ene click chemistry ", Journal of Materials Chemistry B 3.25 (2015): 5028-5034.

International Search Report and Written Opinion for corresponding International application No. PCT/UST2019/052489 dated Jul. 23, 2020 (11 pages).

Lowe, Andrew B. "Thiol-ene "click" reactions and recent applications in polymer and materials synthesis: a first update." Polymer Chemistry 5.17 (2014): 4820-4870.

Feldman, Kathleen E., et al. "Functional Conducting Polymers via Thiol-ene Chemistry." Biosensors 2.3 (2012): 305-317.

Ibrahimova, Vüsala, et al. "Optical and Electronic Properties of Fluorene-Based Copolymers and Their Sensory Applications." Journal of Polymer Science Part A: Polymer Chemistry 51.4 (2013): 815-823.

Extended European Search Report for corresponding European application No. 19887229.3 dated Jun. 29, 2022 (13 pages).

Davis, Andrew R., et al. "Surface Grafting of Vinyl-Functionalized Poly(fluorene)s via Thiol-Ene Click Chemistry." Langmuir 30 15 (2014): 4427-4433.

Davis, Andrew R., et al. "Controlling Optoelectronic Behavior in Poly(fluorene) Networks using Thiol-Ene Thoto-Click Chemistry." Macromolecules 48.6 (2015): 1711-1722.

Hoyle, Charles E., et al. "Thiol-Ene Click Chemistry." Angewandte Chemie International Edition 49.9 (2010) 1540-1573.

Killops, Kato L., et al. "Robust, Efficient, and Orthogonal Synthesis of Dendrimers via Thiol-Ene "Click" Chemistry." Journal of the American Chemical Society 130.15 (2008): 5062-5064.

International Search Report and Written Opinion for International application No. PCT/US19/30950; dated Mar. 19, 2020 (20 pages).

Azoulay, Jasond D., et al. U.S. Appl. No. 63/197,352, filed Jun. 5, 2021. "Infrared Bolometer Based on with Intrinsically Conductive Open-Shell Conjugated Polymers." (23 pages).

Adams, Daniel, et al., U.S. Appl. No. 63/253,529, filed Oct. 23, 2021. "Molecular and Macromolecular Materials & Compositions Exhibiting Magnetic Anisotropies & Ferromagnetism." (34 pages).

Vella, Jarrett H., et al. "Broadband infiared photodetection using a narrow bandgap conjugated polymer." Science Advances 7.24 Article eabg2418 (2021): 1-7.

(56) References Cited

OTHER PUBLICATIONS

London, Alex E., et al. "A high-spin ground-state donor-acceptor conjugated polymer" Science Advances 5.5 Article eaav2336 (2019): 1-9.

Hai, Jiefeng, et al. "Synthesis and photovoltaic performance of novel thiophenyl-methylene-9H-fluorene-based low bandgap polymers." Polymer 54.18 (2013): 4930-4939.

Liu, Jun, et al. "Highly crystalline and low bandgap donor polymers for efficient polymer solar cells" Advanced Materials 24.4 (2012): 538-542.

Abdellah, Alaa, et al. "Transfer printed P3HT/PCBM photoactive layers: From material intermixing to device characteristics." ACS Applied Materials & Interfaces 8.4 (2016): 2644-2651.

International Search Report and Written Opinion for International application No. PCT/US21/43986; dated Dec. 27, 2021 (11 pages).

Taylor, D. M., et al. "Memory effect in the current-voltage characteristic of alow-band gap conjugated polymer", Journal of Applied Physics, American Institute of Physics, 90.1 (2001): 306-309.

Cheng, Yen-Ju, et al. "Synthesis of conjugated polymers for organic solar cell applications." Chemical Reviews 109.11 (2009): 5868-5923.

Lee, Kwang-hoi, et al. "Synthesis and photovoltaic behaviors of narrow-band-gap π-conjugated polymers composed of dialkoxybenzodithiophene-and thiophene-based fused aromatic rings." Journal of Polymer Science Part A: Polymer Chemistry 49.6 (2011): 1427-1433.

Wu, Zhenghui, et al. "Elucidating the detectivity limits in shortwave infrared organic photodiodes." Advanced Functional Materials 28.18 (2018): 1800391-1800400.

Willot, Pieter, et al. "The Use of Cyclopenta[2,1-b,3,4-b']dithiophene Analogues for the Development of Low-Bandgap Materials." Macromolecular Chemistry and Physics 213.12 (2012): 1216-1224.

Gautier, Christelle, et al. "A poly (cyclopentadithiophene) matrix suitable for electrochemically controlled DNA delivery." Analytical Chemistry 79.20 (2007): 7920-7923.

Kostianovskii, Vladislav A., et al. "Synthesis of novel conjugated polymers comprising modified cyclopentadithiophene units in the main chain." High Performance Polymers 29.6 (2017): 670-676.

Kim, Hyonwoong, et al. "Solution-processed phototransistors combining organic absorber and charge transporting oxide for visible to infrared light detection " ACS Applied Materials & Interfaces 11.40 (2019): 36880-36885.

Benincori, T., et al.: "Steric Control of Conductivity in Highly Conjugated Polythiophenes.." Chemistry of Materials 13.5 (2001): 1665-1673.

Loganathan, Kavithaa, et al. "Δ4,4 '-Dicyclopenta [2, 1-b: 3,4-b '] dithiophene. A Conjugated Bridging Unit for Low Band Gap Conducting Polymers." Chemistry of Materials 15.9 (2003): 1918-1923.

Berlin, Anna, et al. "New low-gap polymers from 3,4-ethylenedioxythiophene-bis-substituted electron-poor thiophenes. The roles of thiophene, donor-acceptor alternation, and copolymerization in intrinsic conductivity." Chemistry of Materials 16.19 (2004): 3667-3676.

Bünnagel, Torsten W., et al. "A Novel Poly [2, 6-(4-dialkylmethylenecyclopentadithiophene)] with "in-Plane" Alkyl Substituents." Macromolecules 25.39 (2006): 8870-8872.

Pao, Yu-Chieh, et al. "Synthesis and molecular properties of tricyclic biselenophene-based derivatives with nitrogen, silicon, germanium, vinylidene, and ethylene bridges." Organic Letters 16.21 (2014): 5724-5727.

Sabuj, Md. Abdus, et al. "Benzobisthiadiazole-based high-spin donor-acceptor conjugated polymers with localized spin distribution." Materials Advances 2.9 (2021): 2943-2955.

Hou, Jianhui, et al. "Bandgap and molecular energy level control of conjugated polymer photovoltaic materials based an benzo [1, 2-b: 4, 5-b'] dithiophene." Macromolecules 41.16 (2008): 6012-6018.

Extended European Search Report for European application No. 19869325.1; dated Feb. 16, 2022 (21 pages).

* cited by examiner

THIOL-BASED POST-MODIFICATION OF CONJUGATED POLYMERS

CROSS-REFERENCE TO RELATED APPLICATION

This application claims priority from U.S. Provisional Patent Application Ser. No. 62/734,805 filed Sep. 21, 2018. The entirety of the provisional application is incorporated herein by reference.

STATEMENT OF GOVERNMENT SUPPORT

This invention was made with government support under grant/contract OIA-1632825 awarded by the National Science Foundation and under grant/contract FA9550-17-1-0261 awarded by the U.S. Air Force Office of Scientific Research. The government has certain rights in the invention.

FIELD OF THE INVENTION

This invention relates to the field of polymer science and, more specifically, to novel methods and processes for the preparation of modular conjugated polymers with a wide-range of tunability. Further, the invention provides polymers that are prepared in high yield via a post-modification method. These products comprise oligomeric and polymeric materials having novel molecular architectures, microstructures, and functionalities.

BACKGROUND OF THE INVENTION

The last few decades have witnessed the rise of soft condensed matter systems in the form of solution-processed organic semiconductors (OSCs) based on molecules and polymers. These materials have afforded a new generation of (opto)electronic technologies owing to their synthetic modularity, distinct manufacturing paradigms, rich variety of optical and transport phenomena, and opportunities for innovation in device structures not possible with inorganics. Significant technological milestones have been achieved such as the demonstration of metallic conductivity, photovoltaic efficiencies exceeding 13%, commercially available organic light emitting diodes (OLEDs), NIR photodetectors that do not require cryogenic cooling, carrier mobilities approaching those of state-of-the-art inorganic semiconductors (e.g., metal oxides) and polycrystalline silicon, printed electronic devices, new sensing paradigms, biocompatible medical materials, and a new generation of technologies that were previously unimaginable.

Commercially-mature technologies are anticipated to grow from a total market of $29.28 billion in 2017 to $73.43 billion in 2027. The majority of these sectors, which have created billion-dollar markets, comprise OLEDs (lighting and displays), conductive inks, and sensors, which are based on some of the earliest work in the field. Stretchable electronics, logic and memory, thin-film batteries, photovoltaics, electrochromics, etc. have enormous growth potential as they begin to emerge from R&D. Many other applications will be realized that can replace existing semiconductors in ubiquitous applications and create completely new technologies, applications, and markets. For example, a U.S. market amount of over $140 million is anticipated for organic photodetection technologies by 2023, while over $1 billion is expected for building integrated organic-based photovoltaics. The photonics industry, as a whole, surpassed $1 trillion in 2017 and market penetration of OSCs, associated technologies, and new developments will comprise a progressively larger fraction as technologies mature. Over 3,000 organizations are pursuing organic electronics as the benefits are numerous: low-cost, on-demand printing, mechanical flexibility, transparency, reliability, production processes which are significantly more resource-friendly and energy-efficient ("green" or "sustainable"), scalability, seamless complementary metal-oxide-semiconductor (CMOS) and heterogeneous integration, tolerance toward structural defects and disorder, etc. Although extremely promising, OSCs have not yet revolutionized consumer electronics.

The design and application of OSCs and therefore (opto) electronic technologies has been limited by a lack of synthetic accessibility and solution processability. The conjugated backbone of these materials prevents the solubility required for handling and manipulation for materials processing, generally requiring pendant chains and functionality. To ensure complete incorporation of the desired pendants, it is common to embed these functionalities into monomers for bottom-up materials synthesis. Modular side-chain engineering approaches are necessary owing to the immense difficulty in achieving the appropriate phase characteristics associated with polymers, their blends, and ensemble functionality. The transition-metal catalyzed cross coupling reactions required to polymerize these materials: 1) limits the functionality scope of the final product, 2) necessitates arduous synthetic procedures, and therefore 3) bolsters the cost of the commercial (opto)electronic technologies. An introduced technology that would simplify the synthesis of these conjugated materials and afford the incorporation of functionality that is not amenable to transition-metal cross coupling reactions would be a foundational advancement for the future commercialization of organic electronics. Reactions between a thiol (sulfur-based organic compound) and an alkene, alkyne, and/or Michael acceptor have received significant attention in the organic literature leading to the discovery of a remarkable amount of useful materials and access to unprecedented molecular architectures. The ease with which these reactions can occur without significant byproducts has garnered the uncommon classification of "click chemistries." While immense progress has been made in material science through the incorporation of thiol-ene reactions, very few examples exist of these chemistries to simplify the synthesis of conjugated polymer architectures, and there are no current examples that use thiol-ene chemistry to incorporate functionality that would otherwise "poison" common transition-metal catalysts for conjugated materials synthesis. The present invention overcomes multiple long-standing limitations associated with conjugated polymers by providing novel thiol-based conjugated polymers and methods for synthesis.

SUMMARY OF THE INVENTION

The present invention provides processes for post-modifying conjugated polymers bearing unsaturated functionalities. The post-modifications are facilitated by light-mediated initiators, thermal initiators, and sometimes redox based initiators. Post-modifications are carried out to high conversion via thiol-ene "click" chemistry-based mechanisms. The products comprise monomeric, oligomeric, and polymeric materials with easily accessible pendant functionalities which impart new, distinct, and/or improved properties.

With the foregoing and other objects, features, and advantages of the present invention that will become apparent hereinafter, the nature of the invention may be more clearly understood by reference to the following detailed description of the preferred embodiments of the invention and to the appended claims.

BRIEF DESCRIPTION OF THE DRAWINGS

These drawings accompany the detailed description of the invention and are intended to illustrate further the invention and its advantages. The drawings, which are incorporated in and form a portion of the specification, illustrate certain preferred embodiments of the invention and, together with the entire specification, are meant to explain preferred embodiments of the present invention to those skilled in the art. Relevant FIGURES are shown or described in the Detailed Description of the Invention as follows.

DETAILED DESCRIPTION OF THE INVENTION

Figure 1:
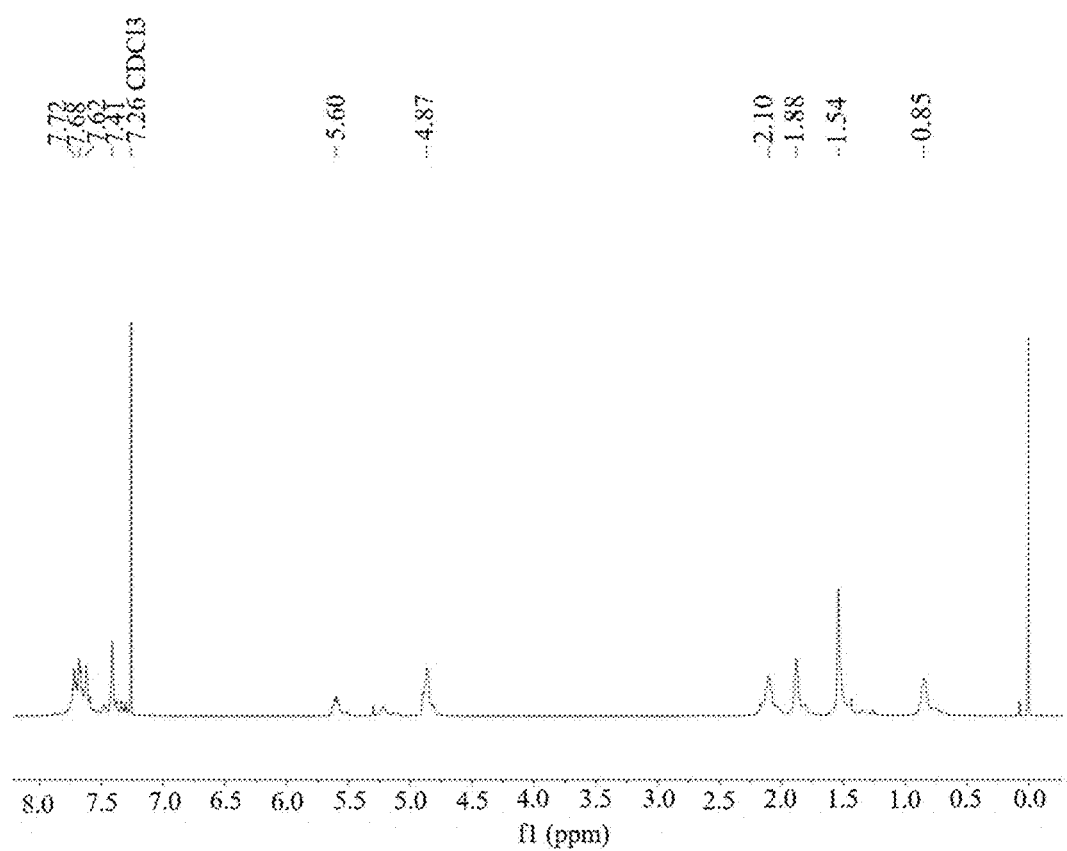
FIG. 1 shows a graphical representation of the $^1$H NMR of polymer P0 of the present invention, wherein the horizontal axis represents chemical shift (ppm), and the vertical axis represents signal intensity.

The invention generally relates to methods and processes for polymerizing and synthesizing new polymers by post-modifying conjugated polymers and oligomers with thiol-based small-molecules. Post-modification entails the covalent attachment of a chemical group and/or groups in a subsequent process to the original polymerization process. Thiols are sulfur-based or sulfur-containing organic chemical compounds analogous to alcohols wherein sulfur replaces the oxygen of the hydroxyl group. The invention provides simplified access to already existing polymers and to novel polymers through thiol-ene "click" chemistry.

The present invention overcomes two major long-standing issues associated with conjugated polymers: 1) common synthetic methodologies either indirectly limit functionality through required intensive bottom-up synthesis, or directly through fundamental limitations of current transition-metal catalyzed polycondensation chemistries; and 2) many current and future commercial applications of conjugated polymers necessitate facile processing, which is difficult without readily-accessible pendant functionalities. The thiol-ene post-modification approach of the invention provides a pathway to quickly access an extensive commercially-available library of pendant functionalities for macromolecular architectures with potential in the areas of optoelectronics and energy and a wide range of other applications.

1. In one embodiment, the invention provides methods and processes for polymerizing and synthesizing new functionalized polymers by post-modifying a conjugated aromatic polymer having or bearing at least one alkene functionalized arene monomer by mixing or polymerizing with at least one small molecule sulfur-based or thiol-based compound. The process comprises mixing or polymerizing the conjugated polymer with a sulfur-based compound and a small-molecule initiator such as a light-mediated initiator, thermal initiator, redox-based initiator, and sometimes another small molecule-based initiator, or a combination thereof, to form or produce a functionalized polymer that comprises one or more than one type of functionalized monomer. An initiator is a small-molecule additive that begins the post-modification reaction. In the case of polymerization or synthesis that combines a single monomer, the result is a homopolymerization product. In other embodiments, the repeat unit of the conjugated polymer contains two or more monomers, or different monomers, and are therefore defined as copolymers with the result being a copolymerization product. The monomers that make up such conjugated polymers are comprised of single or multiple types of arenes, heteroarenes, unsaturated linkers, and sometimes a combination thereof.

"Arene (Ar)" is defined as an optionally substituted aromatic ring system, such as phenyl or naphthyl. Arene groups include monocyclic aromatic rings and polycyclic aromatic ring systems. In some embodiments, arene groups can be unsubstituted. In other embodiments, arene groups can be substituted.

"Heteroarene" is defined as an optionally substituted aromatic ring system where heteroatoms include, but are not limited to, oxygen, nitrogen, sulfur, selenium, phosphorus, etc.

In some embodiments, heteroaryl groups can be unsubstituted. In other embodiments, heteroarene groups can be substituted.

"Unsaturated linker" is defined as an alkyne or optionally substituted alkene unit that connects substituted arenes, substituted heteroarenes, unsubstituted arenes, unsubstituted heteroarenes, or a combination thereof.

2. In one embodiment, the invention provides polymers of the formula (1):

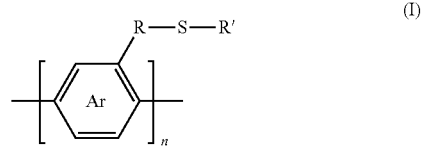

wherein Ar is an arene or heteroarene monomer; R is selected from the chemical groups, that are chains of attached molecules, consisting of linear or branched aliphatic, ethylene glycol, halogen-containing or heteroatom-containing chains of length n, where n is an integer value >1; R' is selected from the chemical groups consisting of unsubstituted hydrocarbyl, substituted hydrocarbyl, unsubstituted aryl, substituted aryl, unsubstituted heteroaryl, substituted heteroaryl, unsubstituted hydrocarbylene, hydrocarbyl, substituted hydrocarbylene, hydrocarbyl, $R^2F$, $R^2Cl$, $R^2Br$, $R^2I$, $R^2CN$, —$R^2$, —$R^2OH$, —$R^2OR^3$, —$R^2COOH$, —$R^2COOR^3$, —$R^2NH_2$, —$R^2NHR^3$, $R^2NR^3R^4$, —$R^2SO_3^-$, —$R^2NH_3^+$, —$R^2COO^-$, or charged functionalities where $R^2$, $R^3$, and $R^4$ are independently selected from a hydrocarbyl or ethylene glycol-based group; and S is a sulfur atom.

Functionalization thereof can occur at one or more than one location on the arene or heteroarene monomer of the repeat unit.

3. In another embodiment, the invention provides polymers of the formula (II):

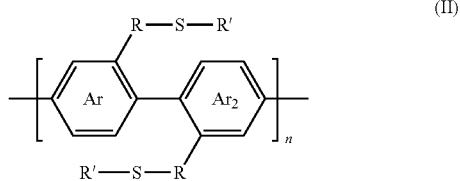

(II)

wherein Ar and $Ar_2$ are independently either an arene or heteroarene monomer; R is selected from the chemical groups, that are chains of attached molecules, consisting of linear or branched aliphatic, ethylene glycol, halogen-containing or heteroatom-containing chains of length n, where n is an integer value >1, R' is selected from the chemical groups consisting of unsubstituted hydrocarbyl, substituted hydrocarbyl, unsubstituted aryl, substituted aryl, unsubstituted heteroaryl, substituted heteroaryl, unsubstituted hydrocarbylene, hydrocarbyl, substituted hydrocarbylene, hydrocarbyl, $R^2F$, $R^2Cl$, $R^2Br$, $R^2I$, $R^2CN$, —$R^2$, —$R^2OH$, —$R^2OR^3$, —$R^2COOH$, —$R^2COOR^3$, —$R^2NH_2$, —$R^2NHR^3$, $R^2NR^3R^4$, —$R^2SO_3^-$, —$R^2NH_3^-$, —$R^2COO^-$, or charged functionalities where $R^2$, $R^3$, and $R^4$ are independently selected from a hydrocarbyl or ethylene glycol-based group; and S is a sulfur atom.

Functionalization thereof can occur at one or more than one location on the arene or heteroarene monomers of the repeat unit. In this embodiment, the two arene or heteroarene monomers, Ar and $Ar_2$, are different aromatic units.

4. In another embodiment, the invention provides polymers of the formula (III):

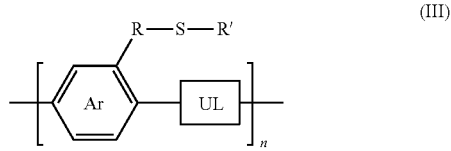

(III)

wherein Ar is an arene or heteroarene monomer; UL is an unsaturated linker such as an alkyne or optionally-substituted alkene unit that connects substituted arenes, substituted heteroarenes, unsubstituted arenes, unsubstituted heteroarenes, or a combination thereof; R is selected from the chemical groups, that are chains of attached molecules, consisting of linear or branched aliphatic, ethylene glycol, halogen-containing or heteroatom-containing chains of length n, where n is an integer value >1; R' is selected from the chemical groups consisting of unsubstituted hydrocarbyl, substituted hydrocarbyl, unsubstituted aryl, substituted aryl, unsubstituted heteroaryl, substituted heteroaryl, unsubstituted hydrocarbylene, hydrocarbyl, substituted hydrocarbylene, hydrocarbyl, $R^2F$, $R^2Cl$, $R^2Br$, $R^2I$, $R^2CN$, —$R^2$, —$R^2OH$, —$R^2OR^3$, —$R^2COOH$, —$R^2COOR^3$, —$R^2NH_2$, —$R^2NHR^3$, $R^2NR^3R^4$, —$R^2SO_3^-$, —$R^2NH_3^-$, —$R^2COO^-$, or charged functionalities where $R^2$, $R^3$, and $R^4$ are independently selected from a hydrocarbyl or ethylene glycol-based group; and S is a sulfur atom.

Functionalization thereof can occur at one or more than one location on the arene or heteroarene monomer of the repeat unit.

The size of the polymers of the invention can vary widely, depending on the properties desired. In some embodiments, n is an integer of at least about 10, at least about 20, at least about 50, or at least about 100. In some embodiments, n is an integer between about 5 and about 10,000, between about 10 and about 10,000, between about 10 and about 5,000, between about and about 2,500, between about 10 and about 1,000, between about 10 and about 500, between about 50 and about 10,000, between about 50 and about 5,000, between about 50 and about 2,500, between about 50 and about 1,000, between about 50 and about 500, between about 100 and about 10,000, between about 100 and about 5,000, between about 100 and about 2,500, between about 100 and about 1,000, or between about 100 and about 500. Other intervals, combining any of the above numerical parameters to form a new interval, can also be used (e.g., n between about 500 and 2,500).

5. In additional embodiments, the invention provides post-functionalization of compounds wherein oligomers of length n are formed, where n is an integer between 1 and 10.

Some embodiments described herein are recited as "comprising" or "comprises" with respect to their various elements. In alternative embodiments, those elements can be recited with the transitional phrase "consisting essentially of" or "consists essentially of" as applied to those elements. In further alternative embodiments, those elements can be recited with the transitional phrase "consisting of" or "consists of" as applied to those elements. Thus, for example, if a composition or method is disclosed herein as comprising A and B, the alternative embodiment for that composition or method of "consisting essentially of A and B" and the alternative embodiment for that composition or method of "consisting of A and B" are also considered to have been disclosed herein. Likewise, embodiments recited as "consisting essentially of" or "consisting of" with respect to their various elements can also be recited as "comprising" as applied to those elements.

6. In additional embodiments, the invention provides polymerized, synthesized conjugated polymers as described in the embodiments herein, but derived from aromatic polymers bearing pendant alkyne groups and functionalities extending from the polymer.

7. In additional embodiments, the invention provides polymerized, synthesized conjugated polymers as described in the embodiments herein, but derived from aromatic polymers bearing pendant unsaturated carbonyl compounds extending from the polymer.

EXAMPLES

General Comments. All manipulations were performed under an inert atmosphere using standard glove box and Schlenk techniques. Reagents, unless otherwise specified, were purchased from Sigma-Aldrich and used without further purification. Tetrahydrofuran was degassed and dried over 4 Å molecular sieves. Deuterated solvents ($CDCl_3$)

were purchased from Cambridge Isotope Labs and used as received. $^1$H and $^{13}$C NMR spectra were collected on a Bruker Ascend 600 MHz spectrometer and chemical shifts, δ (ppm) were referenced to the residual solvent impurity peak of the given solvent. Data reported as: s=singlet, d=doublet, t=triplet, m=multiplet, br=broad; coupling constant(s), J are given in Hz. The number average molecular weight ($M_n$) and dispersity (Đ) were determined by gel permeation chromatography (GPC) relative to polystyrene standards at 160° C. in 1,2,4-trichlorobenzene (stabilized with 125 ppm of BHT) in an Agilent PL-GPC 220 High Temperature GPC/SEC system using a set of four PLgel 10 μm MIXED-B columns. Polymer samples were pre-dissolved at a concentration of 1.00-2.00 mg mL$^{-1}$ in 1,2,4-trichlorobenzene with stirring for 4 h at 150° C. All UV-vis data were recorded using an Aligent Technologies Cary 5000 UV-vis NIR spectrometer. Photoluminescence emission was recorded using a PTI Quantum Master-400 spectrometer equipped with a 75 W xenon arc lamp for direct fluorescence. A K-Sphere Petite Integrating Sphere was integrated into the sample chamber to collect absolute quantum yield values. Fluorescence decay profiles were recorded by the time-correlated single photon counting technique using a Fianium WhiteLase WL-S-400-4-PP excitation source and Picosecond Photon Detector-850.

Example 1. This Example Involved the Synthesis of the Polymer P1

Synthesis of P0. A microwave tube was loaded with 1 (502.0 mg, 1.090 mmol) and 2,5-bis(trimethylstannyl)thiophene (469.0 mg, 1.145 mmol). The tube was brought inside a glove box and approximately 750 μL of a Pd(PPh$_3$)$_4$/xylenes stock solution (5 mol %) was added. The tube was sealed and subjected to 125° C. for 10 min in a microwave reactor with stirring. After this time, the reaction was allowed to cool leaving a solid gelled material. The mixture was precipitated into methanol and collected via filtration. The residual solid was loaded into an extraction thimble and washed with methanol (2 h). The polymer was dried in vacun to give 398.2 mg (94%) of an orange solid. GPC (160° C., 1,2,4-trichlorobenzene) $M_n$=28.9 kg mol$^{-1}$, Đ=4.43. $^1$H NMR (600 MHz, CDCl$_3$): δ 7.85-7.52 (br, 6H), 7.50-7.29 (br, 2H), 5.75-5.50 (br, 2H), 5.00-4.75 (br, 4H), 2.25-2.02 (br, 4H), 1.95-1.75 (br, 4H), 1.03-0.72 (br, 4H). FIG. 1 shows the $^1$H NMR of polymer P0.

Synthesis of P1. A scintillation vial was charged with P0 (35.1 mg, $M_n$=28.9 kg mol$^{-1}$), n-hexyl mercaptan, 96% (600 μL, 4.20 mmol), and THF. The mixture was stirred vigorously and purged with nitrogen. Irgacure® 819 (2 wt. %) was added in the dark and the solution was stirred in a UV chamber (100 mW/cm$^2$) at room temperature (2 h). The solvent was removed under reduced pressure. The mixture

Figure 2:
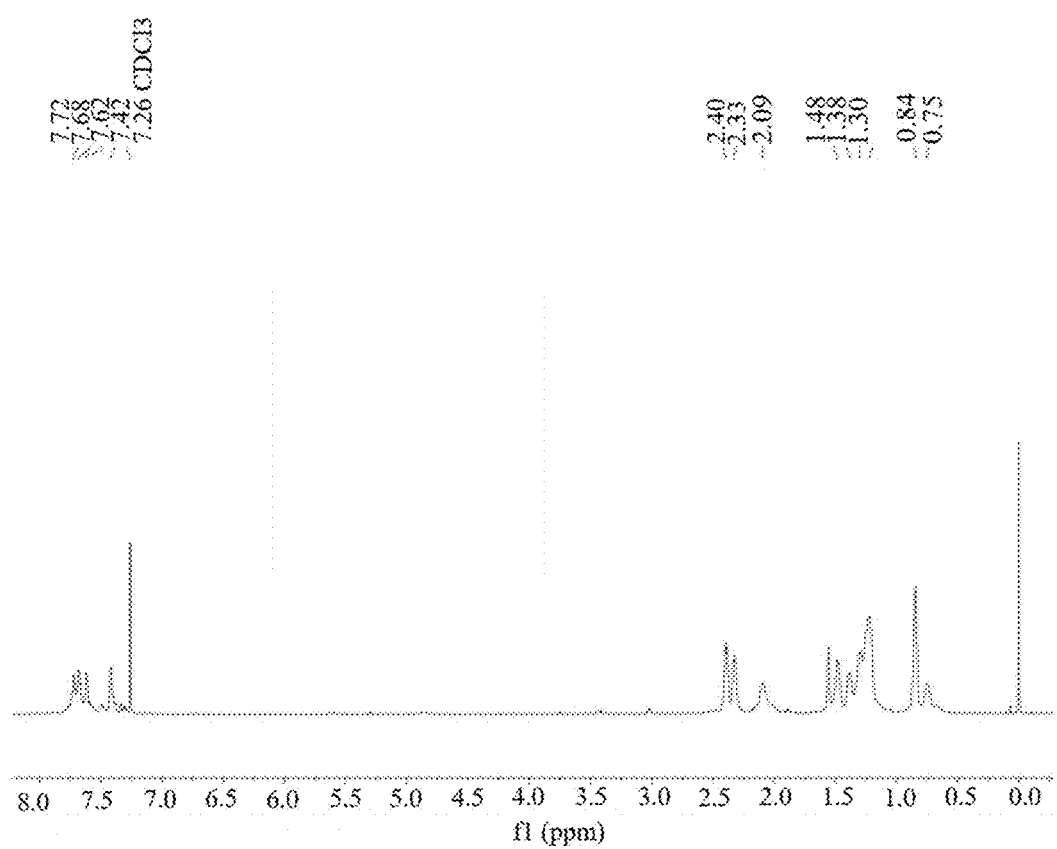
FIG. 2 shows a graphical representation of the $^1$H NMR of polymer P1 of the present invention, wherein the horizontal axis represents chemical shift (ppm), and the vertical axis represents signal intensity.

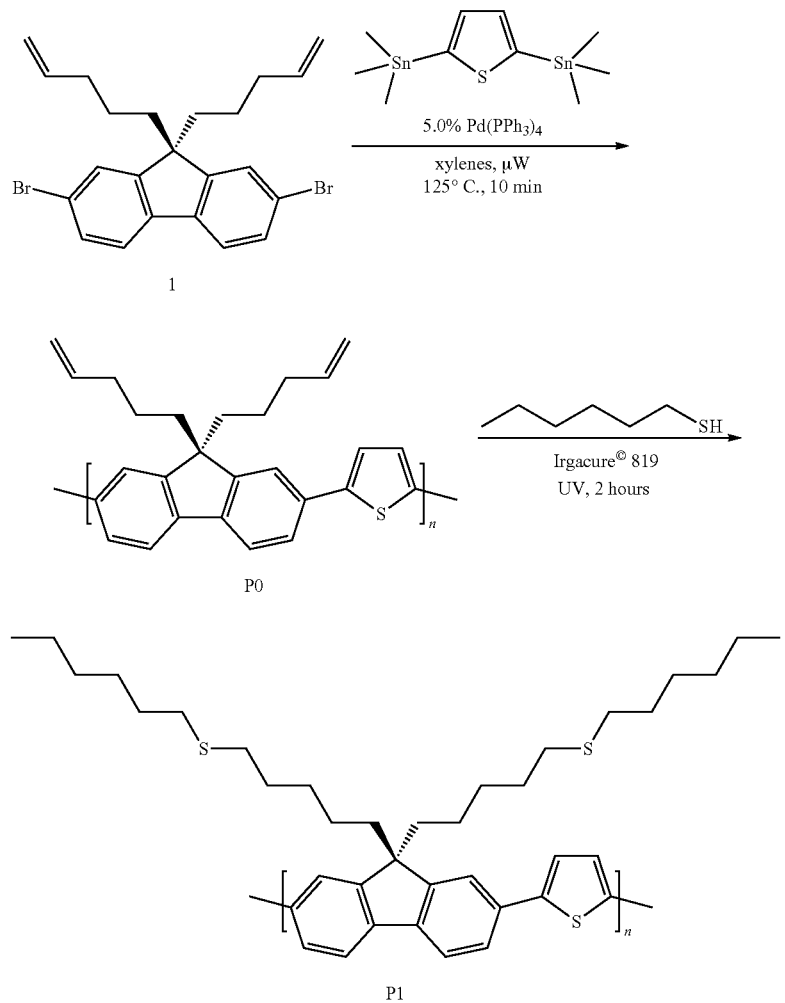

was precipitated into methanol and collected via filtration. The residual solid was loaded into an extraction thimble and washed with methanol (2 h). The polymer was dried in vacuo to afford 39.0 mg (68%) of an orange solid. GPC (160° C., 1,2,4-trichlorobenzene) $M_n$=11.5 kg mol$^{-1}$ Đ=1.46. $^1$H NMR (600 MHz, CDCl$_3$): δ 7.87-7.54 (br, 6H), 7.46-7.31 (br, 2H), 2.49-2.25 (br, 81H), 2.15-2.00 (br, 4H), 1.55-1.30 (br, 12H), 1.30-1.20 (br, 12H), 1.02-0.85 (br, 6H), 0.85-0.60 (br, 4H). FIG. 2 shows the $^1$H NMR of polymer P1.

Example 2. This Example Involved the Synthesis of the Polymer P2

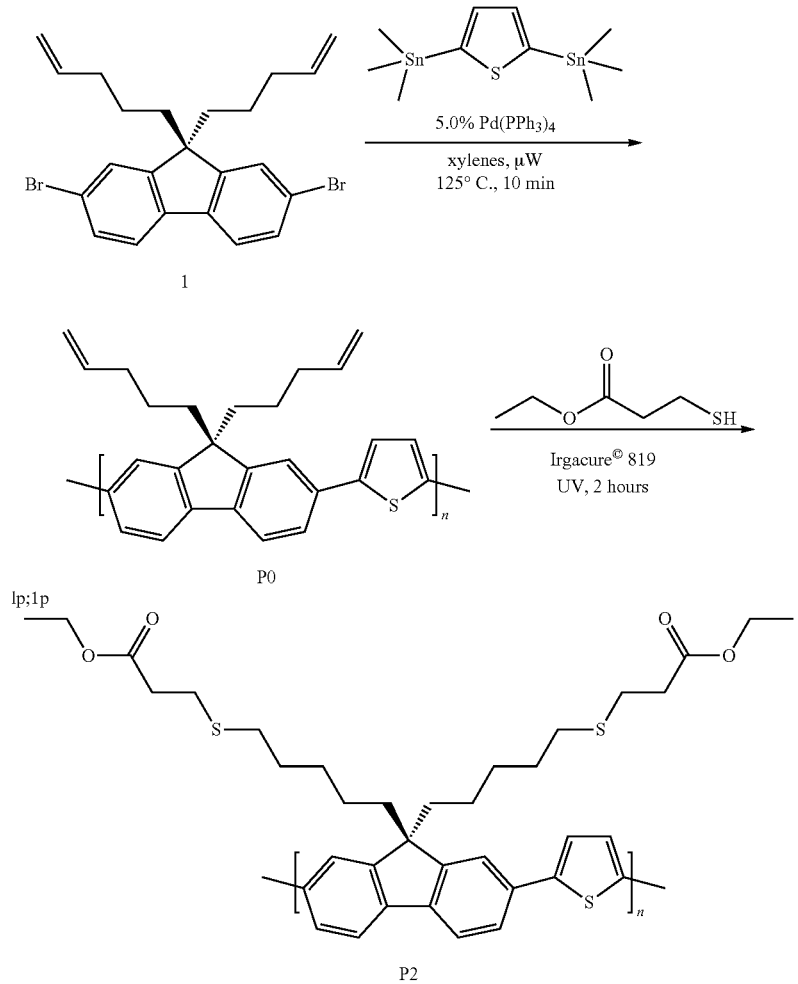

Figure 3:
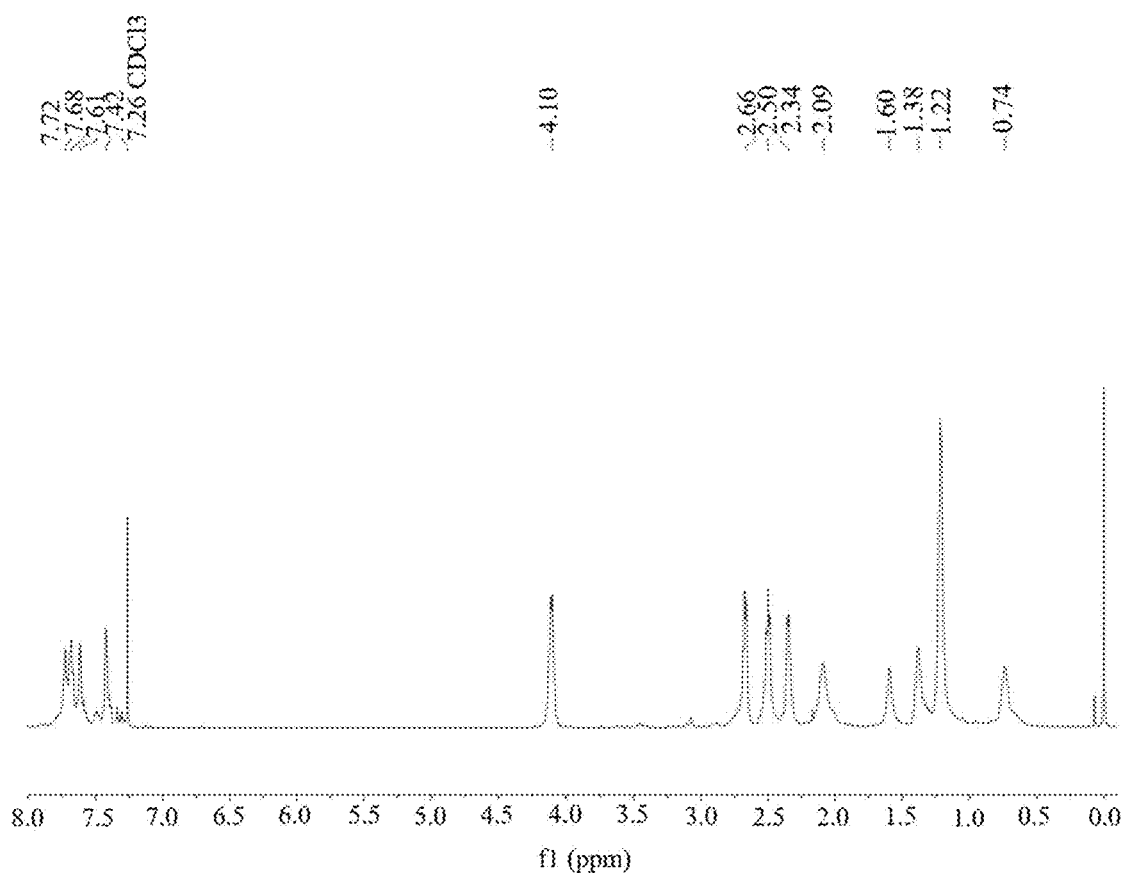
FIG. 3 shows a graphical representation of the $^1$H NMR of polymer P2 of the present invention, wherein the horizontal axis represents chemical shift (ppm), and the vertical axis represents signal intensity.
Figure 4:
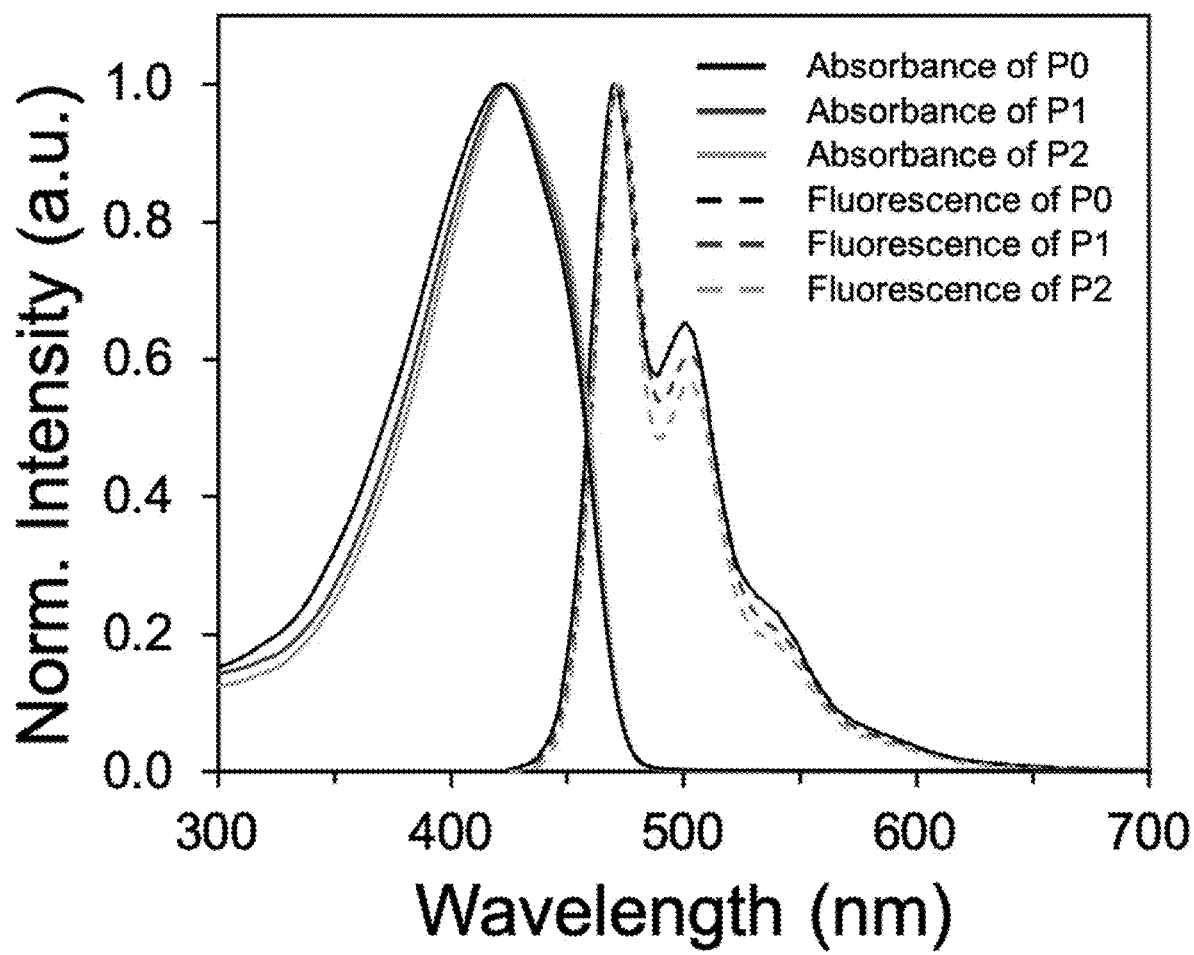
FIG. 4 shows a graphical representation of absorbance and emission spectra of polymers P0, P1, and P2, wherein the horizontal axis represents wavelength (nm), and the vertical axis represents signal intensity.

Synthesis of P2. A scintillation vial was charged with P0 (50.5 mg, $M_n$=28.9 kg mol$^{-1}$), ethyl 3-mercaptopropionate, 99% (400 µL, 3.20 mmol), and THF. The mixture was stirred vigorously and purged with nitrogen. Irgacure® 819 (2 wt. %) was added in the dark and the solution was stirred in a UV chamber (100 mW/cm$^2$) at room temperature (2 h). The solvent was removed under reduced pressure. The mixture was precipitated into methanol and collected via filtration. The residual solid was loaded into an extraction thimble and washed with methanol (2 h). The polymer was dried in vacuo to afford 50.0 mg (58%) of an orange solid. GPC (160° C., 1,2,4-trichlorobenzene) $M_n$=9.6 kg mol$^{-1}$, Đ=1.29. $^1$H NMR (600 MHz, CDCl$_3$): δ 7.88-7.52 (br, 6H), 7.49-7.29 (br, 2H), 4.25-4.00 (br, 4H), 2.75-2.60 (br, 4H), 2.59-2.44 (br, 4H), 2.40-2.29 (br, 4H), 2.25-2.00 (br, 4H), 1.72-1.50 (br, 4H), 1.48-1.30 (br, 4H), 1.28-1.15 (br, 6H), 0.88-0.58 (br, 4H). FIG. 3 shows the $^1$H NMR of polymer P2. FIG. 4 shows the overlay of the absorbance and emission fluorescence spectra of polymers P0, P1, and P2.

Example 3. This is an Example for Quality Comparison of the Polymer P1 Using P3

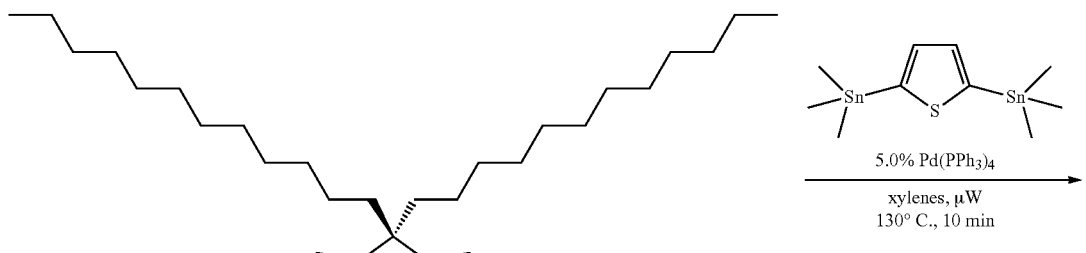

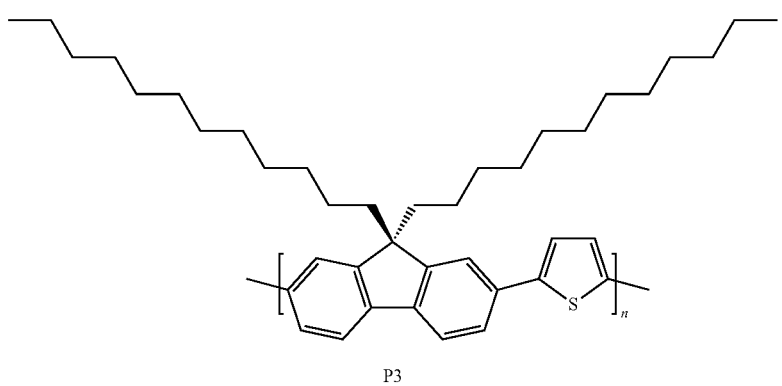

Figure 5:
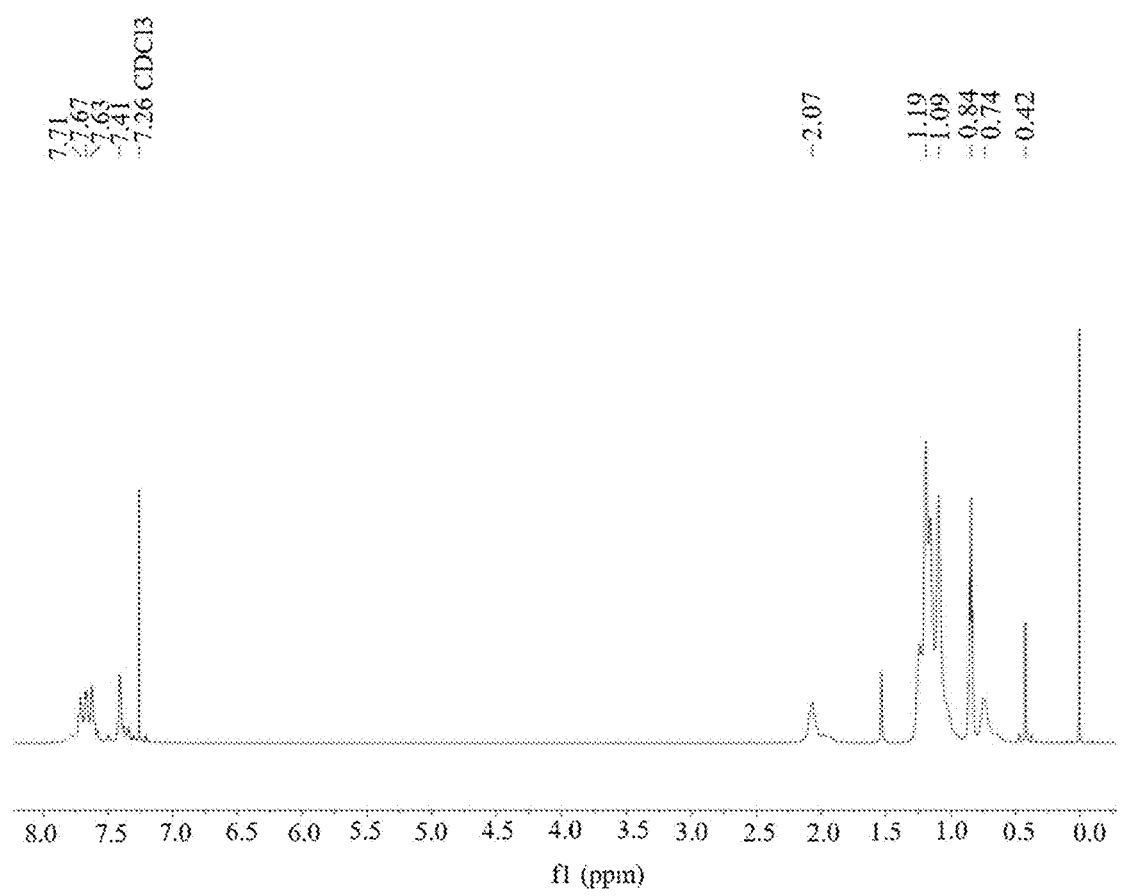
FIG. 5 shows a graphical representation of the $^1$H NMR of polymer P3 of the present invention, wherein the horizontal axis represents chemical shift (ppm), and the vertical axis represents signal intensity.
Figure 6:
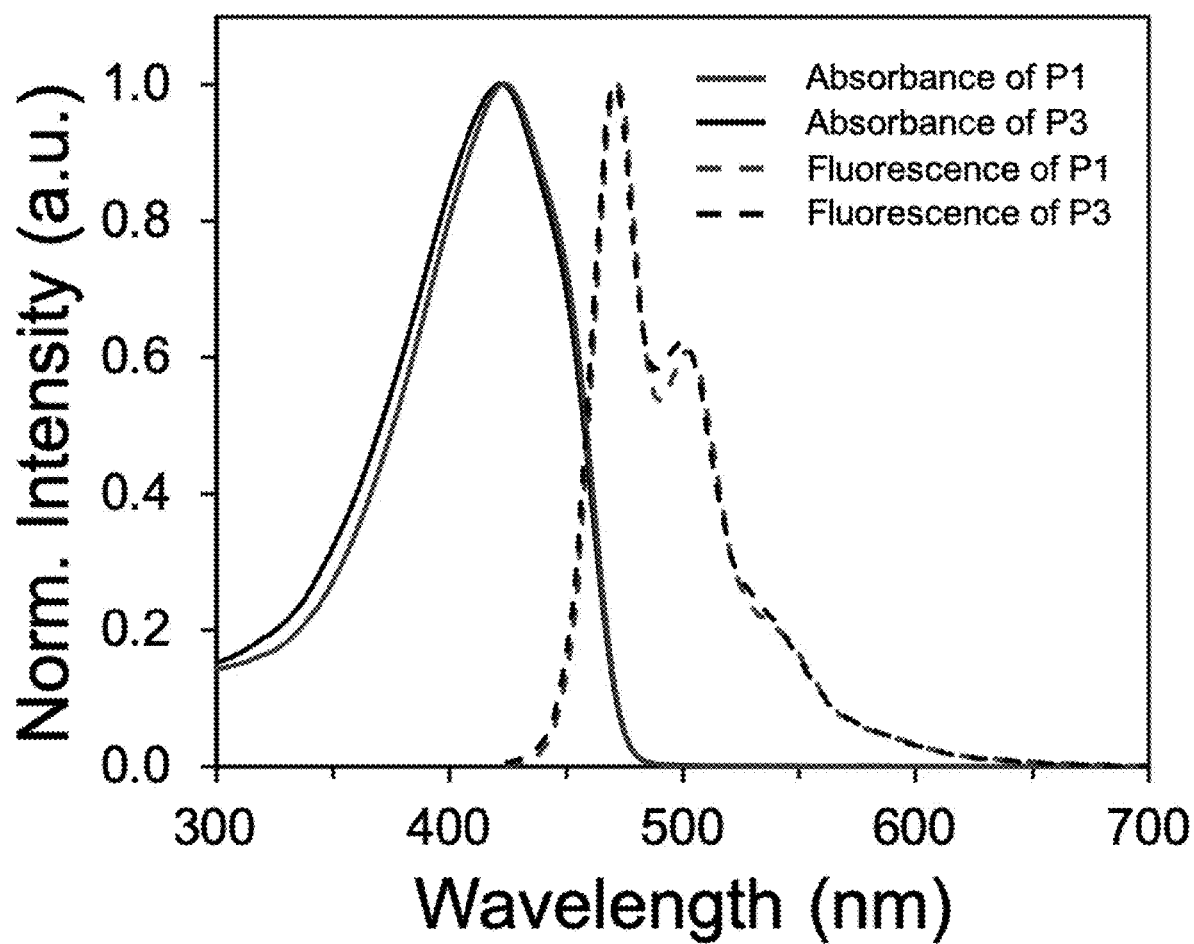
FIG. 6 shows a graphical representation of absorbance and emission spectra of polymers P1 and P3, wherein the horizontal axis represents wavelength (nm), and the vertical axis represents signal intensity.

Synthesis of P3. A microwave tube was loaded with 2 (104.7 mg, 0.160 mmol) and 2,5-bis(trimethylstannyl)thiophene (68.2 mg, 0.170 mmol). The tube was brought inside a glove box and approximately 1000 μL of a Pd(PPh$_3$)$_4$/xylenes stock solution (5 mol %) was added. The tube was sealed and subjected to 130° C. for 10 min in a microwave reactor with stirring. After this time, the reaction was allowed to cool leaving a solid gelled material. The mixture was precipitated into methanol and collected via filtration. The residual solid was loaded into an extraction thimble and washed with methanol (2 h). The polymer was dried in vacuo to give 60.0 mg (65%) of an orange solid. GPC (160° C., 1,2,4-trichlorobenzene) M$_n$=8.6 kg mol$^{-1}$, Đ=1.32. $^1$H NMR (600 MHz, CDCl$_3$): δ 7.88-7.52 (br, 6H), 7.48-7.30 (br, 2H), 2.25-2.00 (br, 8H), 1.32-1.00 (br, 32H), 0.95-0.81 (br, 6H), 0.81-0.55 (br, 4H). FIG. 5 shows the $^1$H NMR of polymer P3. FIG. 6 shows the overlay comparison of the absorbance and emission fluorescence spectra of polymers P1 and P3.

Example 4. This Example Involved the Synthesis of the Polymer P5

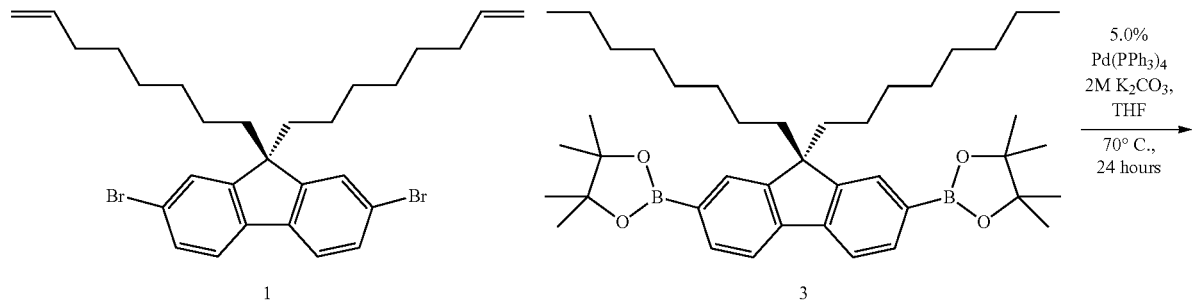

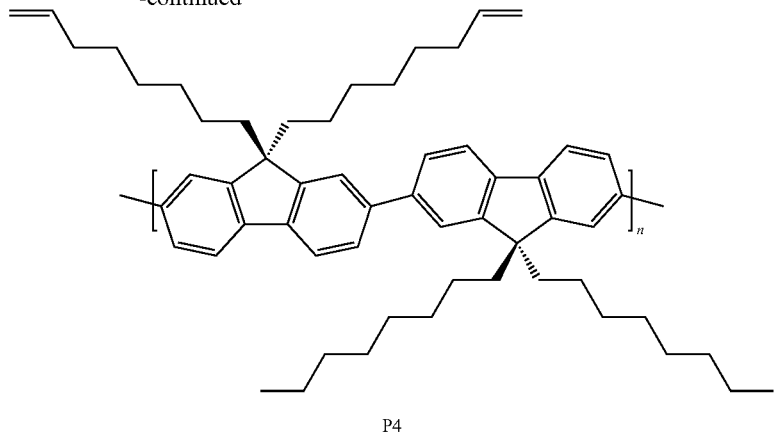

P4

Synthesis of P4. A microwave tube was loaded with 1 (120 mg, 0.221 mmol) and 3 (149 mg, 0.232 mmol), 2 M $K_2CO_3$ (2.21 mL, 20 equiv.) in water, and THF (690 μL). The mixture was sparged with nitrogen, and 1.52 mL of a $Pd(PPh_3)_4$/THF stock solution (5 mol %) was added via syringe. The mixture was stirred vigorously and heated conventionally at 70° C. for 24 h. After this time, the reaction was allowed to cool leaving a solid gelled material. The mixture was precipitated into methanol and collected via filtration. The residual solid was loaded into an extraction thimble and washed with methanol (2 h), acetone (4 h), and hexanes (4 h). The polymer was dried in vacuo to give 123 mg (72%) of a green solid. GPC (160° C., 1,2,4-trichlorobenzene) $M_n$=19.6 kg mol$^{-1}$, Đ=3.4. $^1$H NMR (600 MHz, CDCl$_3$): δ 7.95-7.79 (br, 2H), 7.78-7.55 (br, 4H), 5.89-5.60 (br, 2H), 5.00-4.79 (br, 4H), 2.32-2.10 (br, 4H), 2.10-1.82 (br, 8H), 1.43-1.00 (br, 40H), 0.98-0.75 (br, 6H). Polymer P4 was subsequently post-modified to synthesize polymer P5, as shown and discussed below.

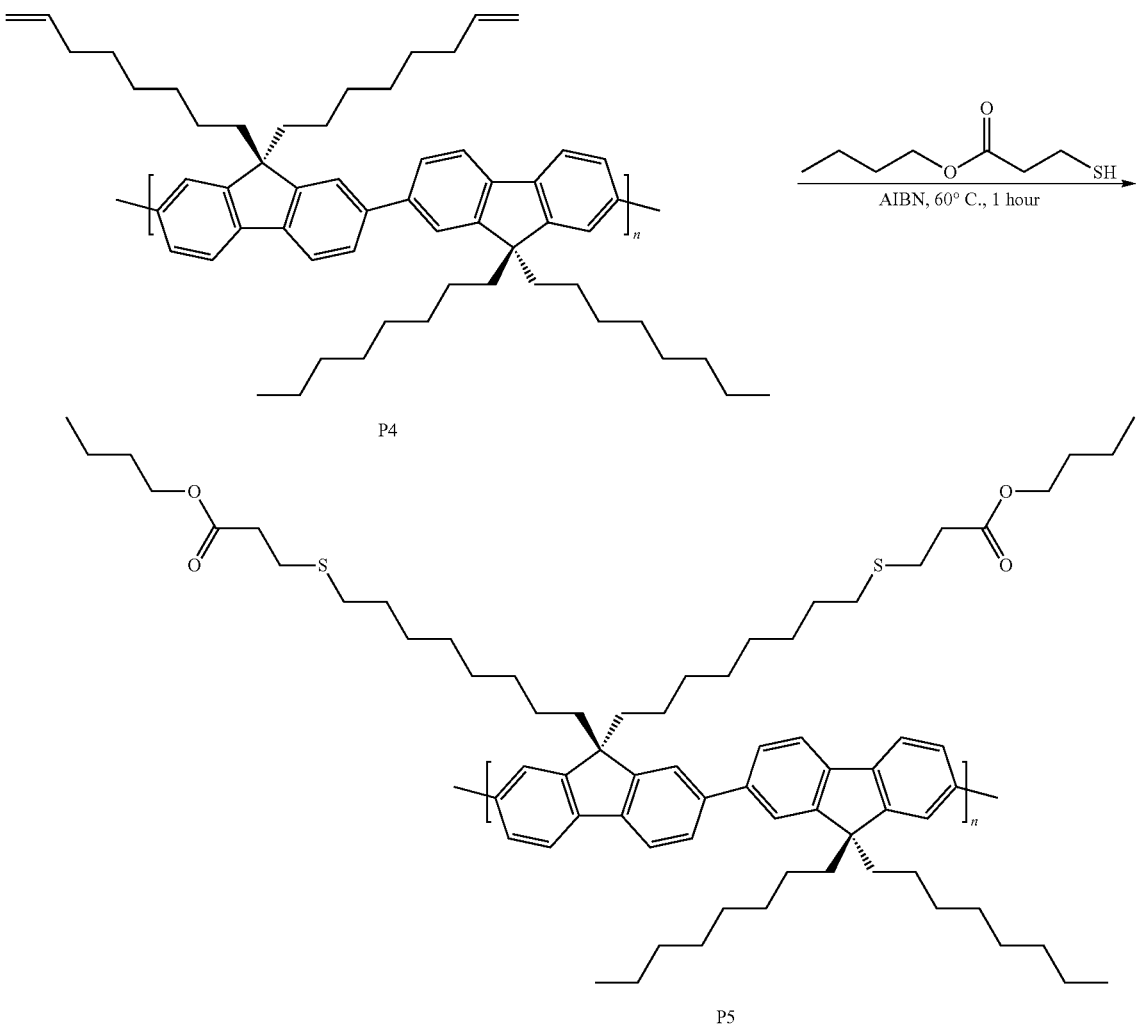

Figure 7:
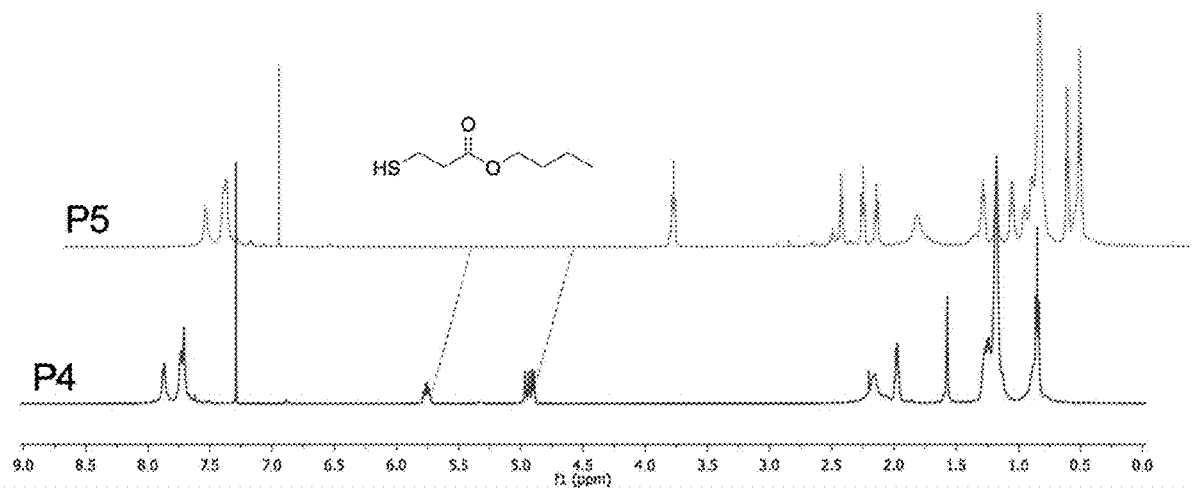
FIG. 7 shows a graphical representation of the $^1$H NMR of polymers P4 and P5 of the present invention, wherein the horizontal axis represents chemical shift (ppm), and the vertical axis represents signal intensity.
Figure 8:
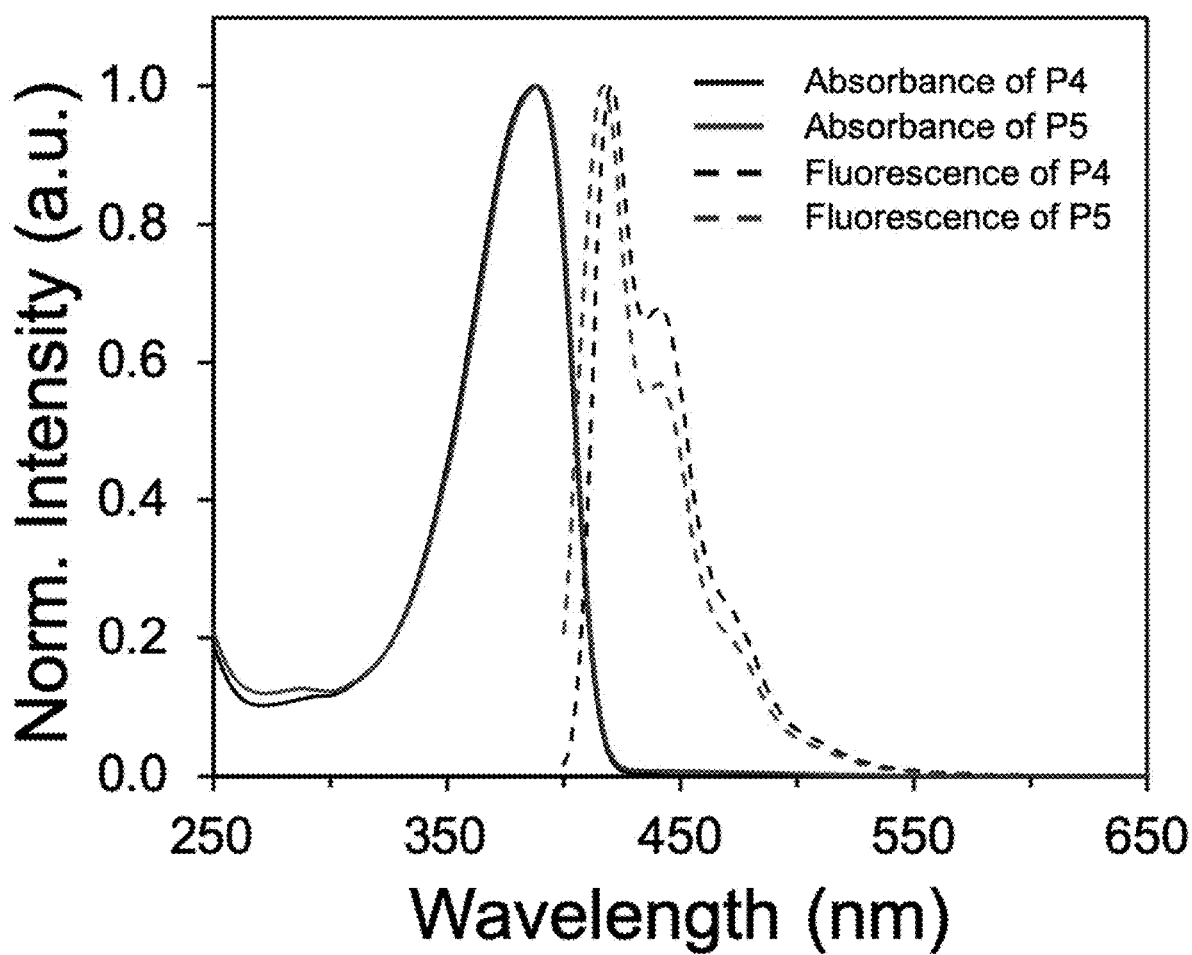
FIG. 8 shows a graphical representation of absorbance and emission spectra of polymers P4 and P5, wherein the horizontal axis represents wavelength (nm), and the vertical axis represents signal intensity.
Figure 9:
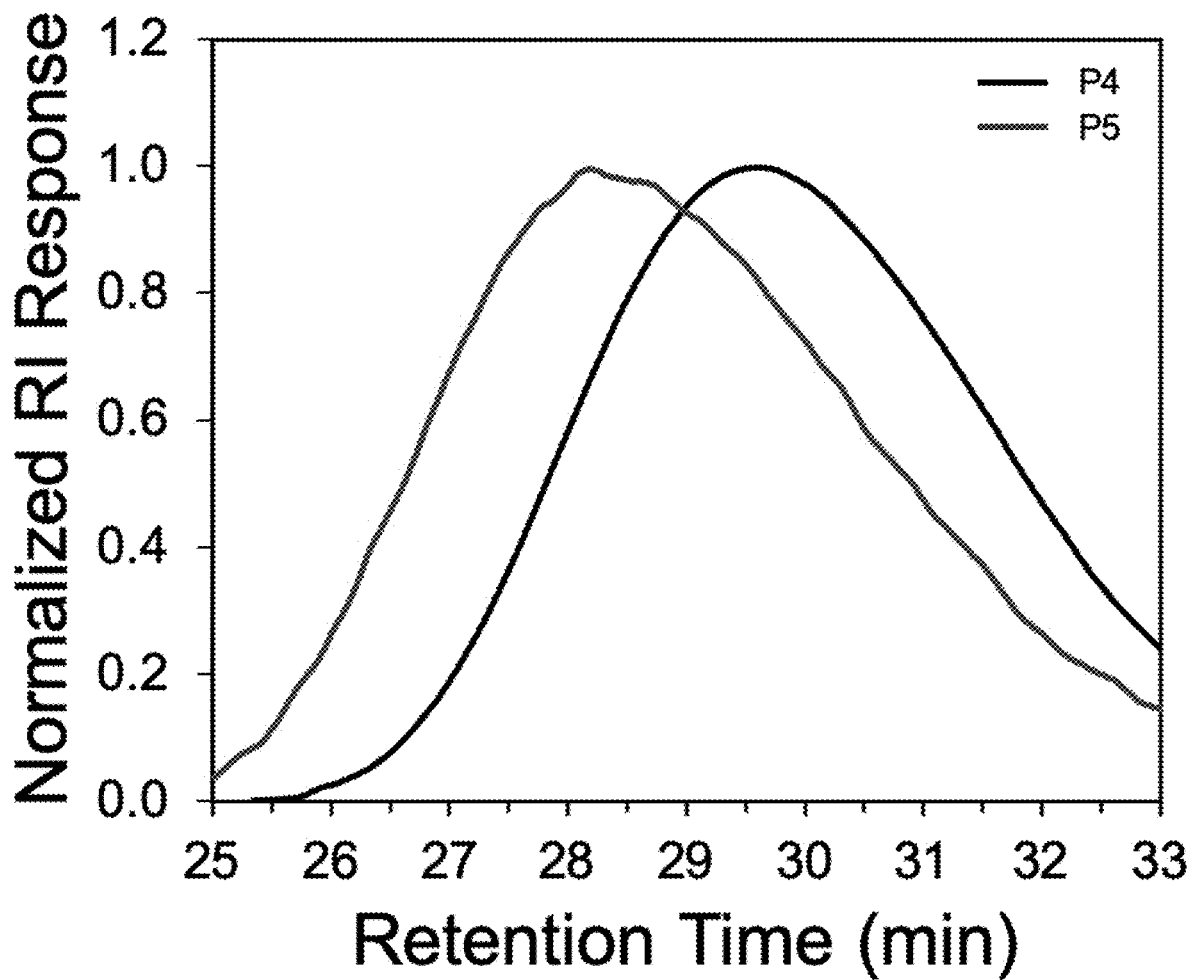
FIG. 9 shows a graphical representation of the GPC chromatogram of polymers P4 and P5 of the present invention.
Figure 10:
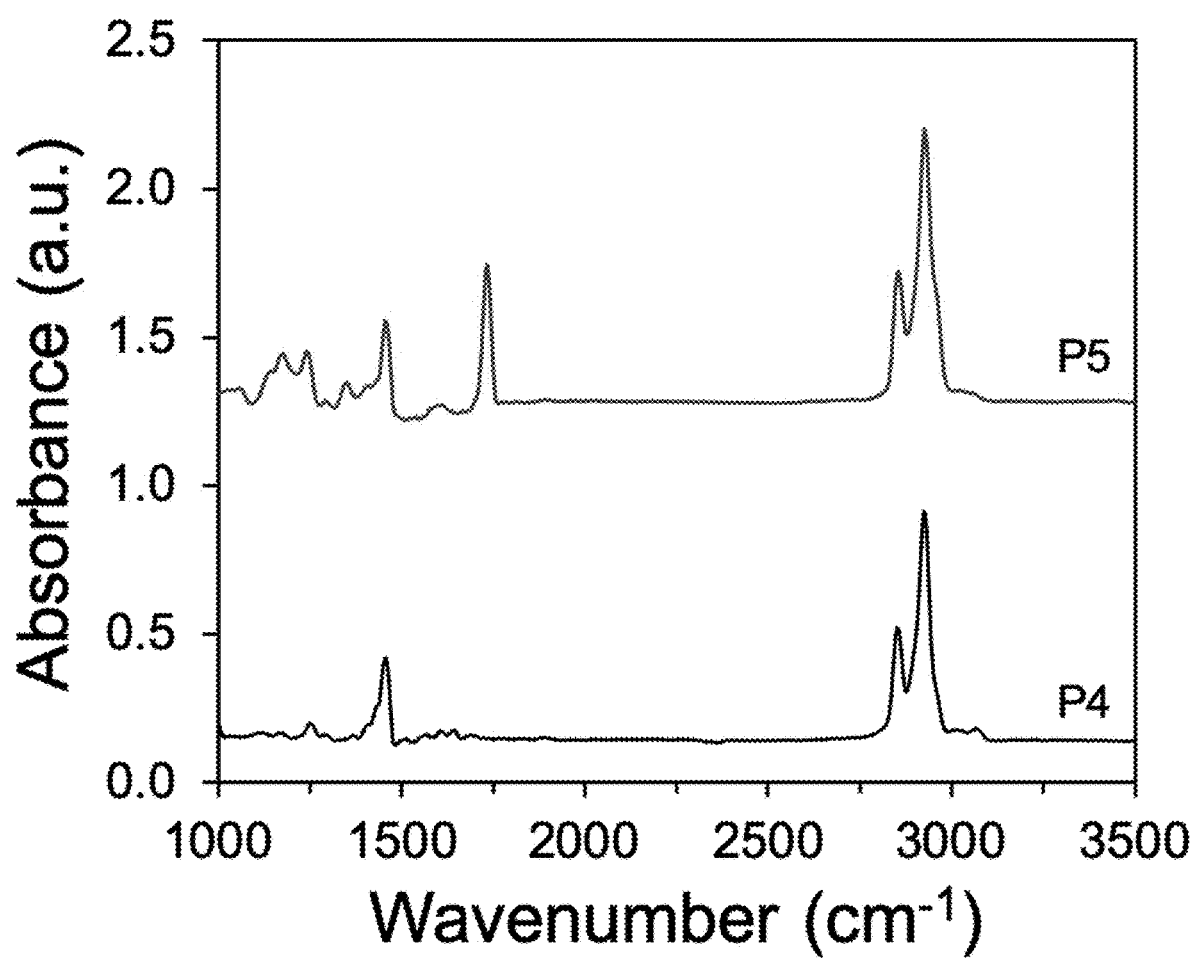
FIG. 10 shows a graphical representation of the FTIR spectra of polymers P4 and P5 of the present invention, wherein the horizontal axis represents wavenumber (cm$^{-1}$), and the vertical axis represents signal intensity.

Synthesis of P5. A scintillation vial was charged with P4 (62.3 mg, $M_n$=19.6 kg mol-), butyl 3-mercaptopropionate, 98% (500 µL, 3.09 mmol), azobisisobutyronitrile (AIBN, 2 mol %), and 500 µL THF. The mixture was stirred vigorously and heated conventionally at 70° C. for 1 h. The solvent was removed under reduced pressure. The mixture was precipitated into acetone and collected via filtration. The residual solid was loaded into an extraction thimble and washed with methanol (8 h) and acetone (4 h). The polymer was dried in vacuo to afford 81.3 mg (92%) of an orange solid. GPC (160° C., 1,2,4-trichlorobenzene) $M_n$=23.4 kg mol$^{-1}$ĐĐ=3.2. $^1$H NMR (600 MHz, CDCl$_3$): δ 7.93-7.78 (br, 2H), 7.77-7.52 (br, 4H), 4.25-4.12 (br, 4H), 3.00-2.79 (br, 4H), 2.77-2.63 (br, 4H), 2.63-2.55 (br, 411), 2.48-2.15 (br, 4H), 1.98-1.82 (br, 4H), 1.48-1.05 (br 50H), 1.00-0.75 (br 12H). FIG. 7 shows the $^1$H NMR comparison of polymers P4 and P5. FIG. 8 shows the absorbance and emission spectra comparison of polymers P4 and P5. FIG. 9 shows the GPC chromatograms comparison of polymers P4 and P5. FIG. 10 shows the FTIR spectra comparison of polymers P4 and P5.

The present invention provides novel methods for preparing new modular conjugated polymers. These novel polymers and products overcome multiple limitations of current conjugated polymers.

All parameters presented herein including, but not limited to, sizes, dimensions, times, temperatures, pressures, amounts, distances, quantities, ratios, weights, volumes, percentages, and/or similar features and data and the like, for example, represent approximate values and can vary with the possible embodiments described and those not necessarily described but encompassed by the invention. Recitations of numerical values and/or numerical ranges can be read to include the term 'about'. Further, references to 'a' or 'an' concerning any particular item, component, material, or product is defined as at least one and could be more than one. The terms 'comprises' and 'includes' and variations thereof are not to have a limiting meaning.

The above detailed description is presented to enable any person skilled in the art to make and use the invention. Specific details have been revealed to provide a comprehensive understanding of the present invention and are used for explanation of the information provided. These specific details, however, are not required to practice the invention, as is apparent to one skilled in the art. Descriptions of specific applications, methods, analyses, materials, components, dimensions, compositions, and calculations are meant to serve only as representative examples. Various modifications to the preferred embodiments may be readily apparent to one skilled in the art, and the general principles defined herein may be applicable to other embodiments and applications while still remaining within the scope of the invention. There is no intention for the present invention to be limited to the embodiments shown and the invention is to be accorded the widest possible scope consistent with the principles and features disclosed herein.

While various embodiments of the present invention have been described above, it should be understood that they have been presented by way of example and not limitation. It will be apparent to persons skilled in the relevant art(s) that various changes in form and detail can be made therein without departing from the spirit and scope of the present invention. In fact, after reading the above description, it will be apparent to one skilled in the relevant art(s) how to implement the invention in alternative embodiments. All embodiments herein can be made without undue experimentation in light of the disclosure. The Applicants have described the preferred embodiments of the invention, but it should be understood that the broadest scope of the invention includes such modifications as additional or different methods and materials. Many other advantages of the invention will be apparent to those skilled in the art from the above descriptions and the subsequent claims. Thus, the present invention should not be limited by any of the above-described exemplary embodiments.

The processes, systems, methods, products, compositions, structures, configurations, and compounds of the present invention are often best practiced by empirically determining the appropriate values of the operating parameters or by conducting simulations to arrive at best design for a given application. Accordingly, all suitable modifications, combinations, and equivalents should be considered as falling within the spirit and scope of the invention.

REFERENCES

1. Arias, A. C.; MacKenzie, J. D.; McCulloch, I.; Rivnay, J.; Salleo, A., Materials and Applications for Large Area Electronics: Solution-Based Approaches. *Chem. Rev.* 2010, 110, 3-24.
2. Chen, S.; Deng, L.; Xie, J.; Peng, L.; Xie, L.; Fan, Q.; Huang, W., Recent Developments in Top-Emitting Organic Light-Emitting Diodes. *Adv. Mater.* 2010, 22, 5227-5239.
3. Gelinck, G.; Heremans, P.; Nomoto, K.; Anthopoulos, T. D., Organic Transistors in Optical Displays and Microelectronic Applications. *Adv. Mater.* 2010, 22, 3778-3798.
4. Baran, D.; Balan, A.; Celcbi, S.; Mcana Esteban, B.; Neugebauer, H.; Saricifici, N. S.; Toppare, L., Processable Multipurpose Conjugated Polymer for Electrochromic and Photovoltaic Applications. *Chem. Mater.* 2010, 22, 2978-2987.
5. Krebs, F. C., Fabrication and Processing of Polymer Solar Cells: A Review of Printing and Coating Techniques. *Sol. Energy Mater. Sol. Cells* 2009, 93, 394-412.
6. Geffroy, B.; le Roy, P.; Prat, C., Organic Light-Emitting Diode (Oled) Technology: Materials, Devices and Display Technologies. *Polym. Int.* 2006, 55, 572-582.
7. Guo, Y.; Yu, G.; Liu, Y., Functional Organic Field-Effect Transistors. *Adv. Mater.* 2010, 22, 4427-4447.
8. Usta, H.; Facchetti, A.; Marks, T. J., N-Channel Semiconductor Materials Design for Organic Complementary Circuits. *Acc. Chem. Res.* 2011, 44, 501-510.
9. Dong, H.; Zhu, H.; Meng, Q.; Gong, X.; Hu, W., Organic Photoresponse Materials and Devices. *Chem. Soc. Rev.* 2012, 41, 1754-1808.
10. Li, G.; Zhu, R.; Yang, Y., Polymer Solar Cells. *Nat Photon* 2012, 6, 153-161.
11. Nelson, J., Polymer: Fullerene Bulk Heterojunction Solar Cells. *Mater. Today* 2011, 14, 462-470.
12. He, F., Yu, L., How Far Can Polymer Solar Cells Go? In Need of a Synergistic Approach. *The Journal of Physical Chemistry* Letters 2011, 2, 3102-3113.
13. Azzellino, G.; Grimoldi, A.; Binda, M.; Caironi, M.; Natali, D.; Sampietro, M., Fully Inkjet-Printed Organic Photodetectors with High Quantum Yield. *Adv. Mater.* 2013, 25, 6829-6833.
14. Bacg, K. J.; Binda, M.; Natali, D.; Caironi, M.; Noh, Y. Y., Organic Light Detectors: Photodiodes and Phototransistors. *Adv. Mater.* 2013, 25, 4267-4295.
15. Lee, K.; Cho, S.; Ileum Park, S.; Heeger, A. J.; Lee, C.-W.; Lee, S.-II., Metallic Transport in Polyaniline. *Nature* 2006, 441, 65-68.

16. Zhao, W.; Li, S.; Yao, H.; Zhang, S.; Zhang, Y.; Yang, B.; Hou, J., Molecular Optimization Enables over 13% Efficiency in Organic Solar Cells. *J. Am. Chem. Soc.* 2017, 139,7148-7151.
17. Gong, X.; Tong, M.; Xia, Y.; Cai, W.; Moon, J. S.; Cao, Y.; Yu, G.; Shich, C. L.; Nilsson, B.; Heeger, A. J., High-Detectivity Polymer Photodetectors with Spectral Response from 300 Nm to 1450 Nm. *Science* 2009, 325, 1665-1667.
18. Gong, X.; Tong, M. H.; Park, S. H.; Liu, M.; Jen, A.; Heeger, A. J., Semiconducting Polymer Photodetectors with Electron and Hole Blocking Layers: High Detectivity in the near-Infrared. *Sensors* 2010, 10, 6488-6496.
19. Tsutsui, Y.; Schweicher, G.; Chattopadhyay, B.; Sakurai, T.; Arlin, J.-B.; Ruzie, C.; Aliev, A.; Ciesielski, A.; Colella, S.; Kennedy, A. R.; Lemaur, V.; Olivier, Y; Hadji, R.; Sanguinet, L.; Castet, F.; Osella, S.; Dudenko, D.; Beljonne, D.; Cornil, J.; Samori, P.; Seki, S.; Geerts, Y H., Unraveling Unprecedented Charge Carrier Mobility through Structure Property Relationship of Four Isomers of Didodecyl[1]Benzothieno[3,2-B][1]Benzothiophene. *Adv. Mater.* 2016, 28, 7106-7114.
20. Tseng, H.-R.; Phan, H.; Luo, C.; Wang, M.; Perez, L. A.; Patel, S. N.; Ying, L.; Kramer, E. J.; Nguyen, T.-Q.; Bazan, G. C.; Heeger, A. J., High-Mobility Field-Effect Transistors Fabricated with Macroscopic Aligned Semiconducting Polymers. *Adv. Mater.* 2014, 26, 2993-2998.
21. McQuade, D. T.; Pullen, A. E.; Swager, T. M., Conjugated Polymer-Based Chemical Sensors. *Chem. Rev.* 2000, 100, 2537-2574.
22. Irimia-Vladu, M., "Green" Electronics: Biodegradable and Biocompatible Materials and Devices for Sustainable Future. (*Chem. Soc. Rev.* 2014, 43, 588-610.
23. Lin, P.; Yan, F., Organic Thin-Film Transistors for Chemical and Biological Sensing. *Adv. Mater.* 2012, 24, 34-51.
24. Elkington, D.; Cooling, N.; Belcher, W.; Dastoor, P.; Zhou, X., Organic Thin-Film Transistor (Otft)-Based Sensors. *Electronics* 2014, 3, 234-254.
25. Mulla, M. Y.; Tuccori, E.; Magliulo, M.; Lattanzi, G., Palazzo, G.; Persaud, K.; Torsi, L., Capacitance-Modulated Transistor Detects Odorant Binding Protein Chiral interactions. *Nature communications* 2015, 6, 6010.
26. Palazzo, G.; De Tullio, D.; Magliulo, M.; Mallardi, A.; Intranuovo, F.; Mulla, M. Y.; Favia, P.; Vikholm-Lundin, I.; Torsi, L., Detection Beyond Debye's Length with an Electrolyte-Gated Organic Field-Effect Transistor. *Adv. Mater.* 2015, 27, 911-916.
27. Torsi, L.; Magliulo, M.; Manoli, K.; Palazzo, G., Organic Field-Effect Transistor Sensors: A Tutorial Review. *Chem. Soc. Rev.* 2013, 42, 8612-8628.
28. Das, R.; Harrop, P., Printed, Organic & Flexible Electronics: Forecasts, Players & Opportunities 2013-2023. *Cambridge: IDTechEx* 2013.
29. Chang, J. S; Facchetti, A. F.; Reuss, R., A Circuits and Systems Perspective of Organic/Printed Electronics: Review, Challenges, and Contemporary and Emerging Design Approaches. *IEEE Journal on Emerging and Selected Topics in Circuits and Systems* 2017, 7, 7-26.
30. Lowe, A. B., Thiol-ene "click" reactions and recent applications in polymer and materials synthesis: a first update. *Polym. Chem.* 2014, 5, 4820-4870.
31. Feldman, K. E.; Martin,). C., Functional Conducting Polymers via Thiol-ene Chemistry. *Biosensors.* 2012, 2, 305-317.
32. Ibrahimova, V.; Kocak, M. E.; Onal, A. M.; Tuncel, D., Optical and Electronic Properties of Fluorene-Based Copolymers and Their Sensory Applications. *J. Polym. Sci. A.* 2013, 51, 815-823.

What is claimed is:

1. A method of synthesizing a functionalized (co)polymer made from at least one alkene or alkyne functionalized arene or heteroarene monomer, the method comprising a step of:

reacting a conjugated aromatic (co)polymer with at least one small molecule sulfur-containing or thiol-containing compound and a small-molecule initiator to form a functionalized (co)polymer comprising one or more repeating units selected from the group consisting of P1, P2, and P5:

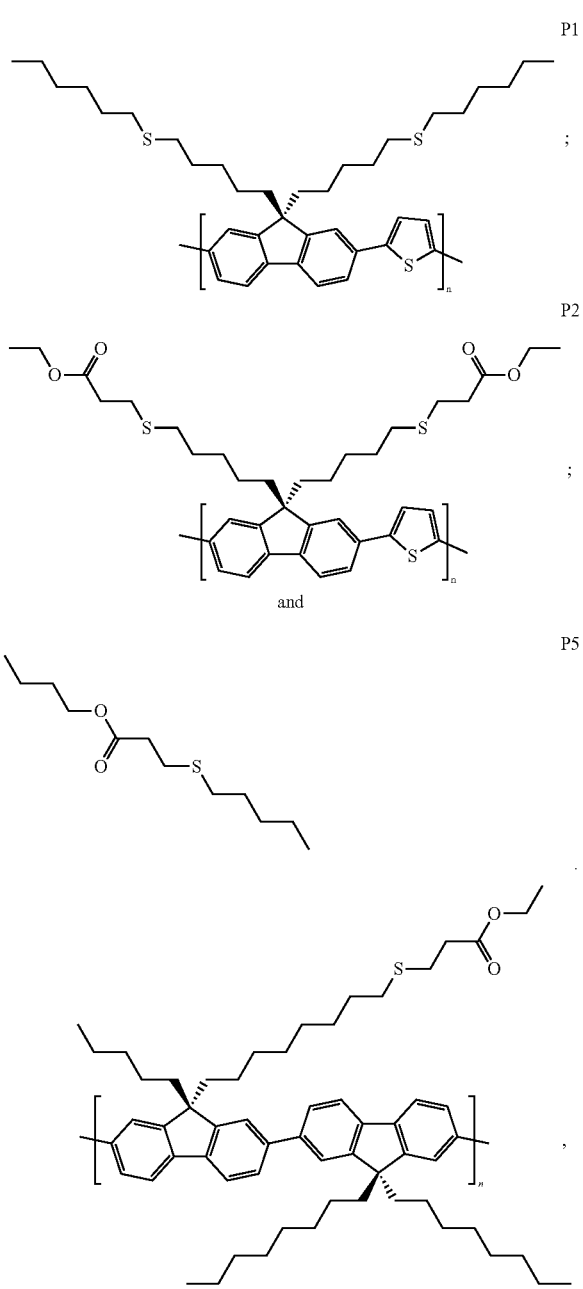

wherein n is an integer>1.

* * * * *